(12) United States Patent
Shiomi

(10) Patent No.: US 9,018,632 B2
(45) Date of Patent: Apr. 28, 2015

(54) TFT SUBSTRATE AND METHOD FOR CORRECTING WIRING FAULT ON TFT SUBSTRATE

(75) Inventor: Makoto Shiomi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/113,690

(22) PCT Filed: Apr. 23, 2012

(86) PCT No.: PCT/JP2012/060892
§ 371 (c)(1),
(2), (4) Date: Oct. 24, 2013

(87) PCT Pub. No.: WO2012/147704
PCT Pub. Date: Nov. 1, 2012

(65) Prior Publication Data
US 2014/0312351 A1  Oct. 23, 2014

(30) Foreign Application Priority Data
Apr. 28, 2011  (JP) .................................. 2011-102376

(51) Int. Cl.
*H01L 27/12* (2006.01)
*H01L 21/768* (2006.01)
*G02F 1/1362* (2006.01)

(52) U.S. Cl.
CPC ........ *H01L 21/76892* (2013.01); *H01L 27/124* (2013.01); *G02F 2001/136263* (2013.01); *H01L 27/1259* (2013.01)

(58) Field of Classification Search
CPC .................................................. H01L 27/1244
See application file for complete search history.

(56) References Cited

U.S. PATENT DOCUMENTS

| 6,548,831 B1 | 4/2003 | Tokuhiro et al. |
| 2009/0115708 A1 | 5/2009 | Sagawa et al. |

FOREIGN PATENT DOCUMENTS

| JP | 09-80470 A | 3/1997 | |
| JP | 2000-235190 A | 8/2000 | |
| JP | 2003-156763 A | 5/2003 | |
| JP | 2004-347891 A | 12/2004 | |
| JP | 2009-134233 A | 6/2009 | |
| JP | 2010-072397 A | 4/2010 | |
| KR | 2001-66243 A | * 7/2001 | ............ H01L 29/786 |

OTHER PUBLICATIONS

International Search Report PCT/ISA/210 for International Application No. PCT/JP2012/060892 Dated Jun. 21, 2012.
Written Opinion of the International Searching Authority PCT/ISA/237 for International Application No. PCT/JP2012/060892 dated Jun. 21, 2012.

* cited by examiner

*Primary Examiner* — Stephen W Smoot
(74) *Attorney, Agent, or Firm* — Harness, Dickey & Pierce

(57) ABSTRACT

A TFT substrate is provided in which a wire defect can be easily solved. A method of solving a wire defect in the TFT substrate is also provided. In an embodiment, the TFT substrate is configured so that (i) a plurality of gate lines and a plurality of source lines are arranged in a matrix manner, (ii) a TFT is provided in at least one of intersection regions where the plurality of gate lines and the plurality of source lines intersect with each other, and (iii) the at least one of intersection regions is divided by a slit, which is formed in a corresponding one of the plurality of gate lines, so that the at least intersection region is divided into parts arranged along a longitudinal direction of the plurality of source lines.

5 Claims, 6 Drawing Sheets

Prior Art

Prior Art

Prior Art

TFT SUBSTRATE AND METHOD FOR CORRECTING WIRING FAULT ON TFT SUBSTRATE

TECHNICAL FIELD

The present invention relates to (i) a TFT substrate and (ii) a method of solving a wire defect in the TFT substrate.

BACKGROUND ART

Conventionally, a defect of a wire such as a gate line or a source line in a TFT substrate is solved by (i) cutting the wire and then (ii) restoring an electric connection of the wire by use of a bypass line which is provided outside of a display region.

For example, Patent Literature 1 discloses a method of repairing a wire defect, such as a short circuit of a source line or a lack of a source line, in a TFT substrate. According to the method, an electric connection of a wire is restored by (i) cutting the wire at a point in the upstream of a defect caused in the wire, and then (ii) connecting the wire to a bypass line which is provided outside of a display region.

Specifically, Patent Literature 1 discloses a method of repairing a wire defect in a TFT substrate 100 (see FIG. 4). The TFT substrate 100 is configured such that (i) gate lines $G_1$ through $G_m$ and drain lines (source lines) $D_1$ through $D_n$ are arranged in a matrix manner and (ii) a plurality of repair lines (preliminary wires) $R_1$ through $R_s$ are provided along the periphery of the TFT substrate 100 so that each of the plurality of repair lines $R_1$ through $R_s$ (i) forms a quadrangular configuration with one (1) corner cut and (ii) intersects two positions of each of the gate lines $G_1$ through $G_m$ and the drain lines (source lines) $D_1$ through $D_n$, at which two positions each of the plurality of repair lines $R_1$ through $R_s$ is electrically insulated from each of the gate lines $G_1$ through $G_m$ and the drain lines $D_1$ through $D_n$. According to the method, an electric disconnection B of the gate line G or the drain line D is repaired by providing a bypass line for the electric disconnection B. Specifically, the bypass line is provided by connecting the gate line G or the drain line D to a repair line R at two intersections where the gate line G or the drain line D intersects the repair line R. Further, according to the method, a short circuit S, which has happened to an intersection where the gate line $G_g$ and the drain line $D_r$ intersect with each other, is repaired by (i) cutting and removing the intersection and then (ii) providing bypass lines with use of two repair lines in the same manner as the above case where the electric disconnection B is repaired.

CITATION LIST

Patent Literature

Patent Literature 1
Japanese Patent Application Publication, Tokukaihei, No. 9-80470 A (Publication Date: Mar. 28, 1997)

SUMMARY OF INVENTION

Technical Problem

However, the method of repairing a wire defect in a TFT substrate (see Patent Literature 1) has a problem that the method cannot repair a wire defect in a large capacity TFT matrix substrate which requires driving upper and lower parts of a panel separately.

The present invention was made in view of the conventional problem, and an object of the present invention is to provide (i) a TFT substrate in which a wire defect can be easily solved and (ii) a method of easily solving a wire defect in a TFT substrate.

Solution to Problem

Taking the conventional problem into account, the inventors of the present invention studied why the method described in Patent Literature 1 cannot repair a wire defect in a large capacity TFT matrix substrate which requires driving upper and lower parts of a panel separately. According to the method described in Patent Literature 1, a cut source line is bypassed by use of a repair line. According to a panel whose upper and lower parts are driven separately, however, drivers are provided above and below the panel, respectively, in a plan view, and each source line is divided into two in the respective upper and lower parts of the panel. Therefore, an electric connection of the cut source line is not restored even if a bypass line is provided. Further, the panel has no space for a line which is used for an electric reconnection.

Persons skilled in the art (including the inventors of the present invention) have sufficiently recognized that even in a case where upper and lower parts of a panel are not driven separately, the method described in Patent Literature 1 causes a defect, because a panel which can process (display) much video data is generally apt to be short of a writing time period. That is, the method described in Patent Literature 1 has problems that (1) it is difficult to apply the method described in Patent Literature 1 to a panel which can process (display) much video data, because one (1) scan line should be driven during a time period obtained by dividing a frame time period by the number of scan lines, (2) in a case where scan lines are not scanned at a double speed, flickers are caused, whereas, in a case where scan lines are scanned at a double speed, it comes short of charging time, (3) double-speed full writing is required, and cross talk is caused due to a combination of backlights, and (4) image blur is caused, and a non-target line cannot be controlled.

The inventors of the present invention studied how to solve a defect of a source line without use of any bypass lines. As a result of the study, the inventors of the present invention found that, by forming a gate line in the shape of a ladder at intersections (connections, nodes) where the gate line intersects source lines, the electric connection of the gate line is not impaired as a whole even in a case where a part of the gate line is cut in the vicinity of a wire defect. The electric connection is not impaired as a whole because, even in the case, the other part of the gate line remains intact. That is, the inventors of the present invention uniquely found a configuration in which a gate line is branched. The inventors of the present invention also found that (i) a preliminary line is provided in the vicinity of an intersection part where a source line and a gate line intersect with each other and (ii) by use of the preliminary line, a function of the source line, which has been accidentally cut in solving a wire defect, is restored. That is, the inventors of the present invention uniquely found a configuration in which a function of a source line which has been cut is restored by connecting the source line to a preliminary line which is provided in advance. The present invention was completed on the basis of the inventors' unique findings.

According to a TFT substrate of the present invention, a region where a gate line and a source line intersect with each other (that is, an intersection region) is thus divided by forming a slit in the gate line so that the gate line is branched via the slit. Therefore, even in a case where a wire defect occurs in one of parts into which the intersection region is divided, it is possible to repair the wire defect by cutting at least a part of the gate line thus branched, without impairing an electric connection of the entire TFT substrate.

That is, in order to attain the object, the TFT substrate of the present invention is configured such that (i) a plurality of gate lines and a plurality of source lines are arranged in a matrix manner and (ii) a TFT is provided in at least one of intersection regions where the plurality of gate lines and the plurality of source lines intersect with each other, wherein the at least one of intersection regions is divided by a slit, which is formed in a corresponding one of the plurality of gate lines, so that the at least intersection region is divided into parts arranged along a longitudinal direction of the plurality of source lines.

According to the configuration, the at least one of intersection regions is divided by the slit, which is formed in the corresponding one of the plurality of gate lines, so that the at least intersection region is divided into parts arranged along the longitudinal direction of the plurality of source lines. Therefore, even in a case where a wire defect occurs in the at least intersection region, it is possible to keep an electric connection of the whole TFT substrate by cutting a part of the corresponding gate line, which part is present in the at least intersection region. As such, a wire defect can be easily solved in the TFT substrate of the present invention.

Advantageous Effects of Invention

The TFT substrate of the present invention is thus configured such that (i) a plurality of gate lines and a plurality of source lines are arranged in a matrix manner and (ii) a TFT is provided in at least one of intersection regions where the plurality of gate lines and the plurality of source lines intersect with each other, wherein the at least one of intersection regions is divided by a slit, which is formed in a corresponding one of the plurality of gate lines, so that the at least intersection region is divided into parts arranged along a longitudinal direction of the plurality of source lines.

Therefore, the TFT substrate of the present invention brings about an effect that a wire defect can be solved in a large capacity TFT matrix substrate which requires driving upper and lower parts of a panel separately. Needless to say, the present invention is applicable to a substrate other than the large capacity TFT matrix substrate. The present invention brings about an effect that a wire defect can be easily solved in any TFT substrates.

DESCRIPTION OF EMBODIMENTS

The following description will discuss in detail an embodiment of the present invention. Note, however, that the scope of the present invention is not limited to the description, and embodiments other than the embodiment below can be appropriately modified and performed within a scope where the subject matter of the present invention is not impaired.

(I) Configuration of TFT Substrate of the Present Embodiment

A TFT substrate of the present embodiment is configured so that (i) a plurality of gate lines and a plurality of source lines are arranged in a matrix manner and (ii) a TFT is provided in at least one of intersection regions where the plurality of gate lines and the plurality of source lines intersect with each other, wherein the at least one of intersection regions is divided by a slit, which is formed in a corresponding one of the plurality of gate lines, so that the at least intersection region is divided into parts arranged along a longitudinal direction of the plurality of source lines.

It is preferable to configure the TFT substrate of the present embodiment such that a preliminary line is provided along one of the plurality of source lines which crosses the slit so that, in a case where the source line is cut, the preliminary line is connected to the source line so as to form a second source line.

Figure 1:
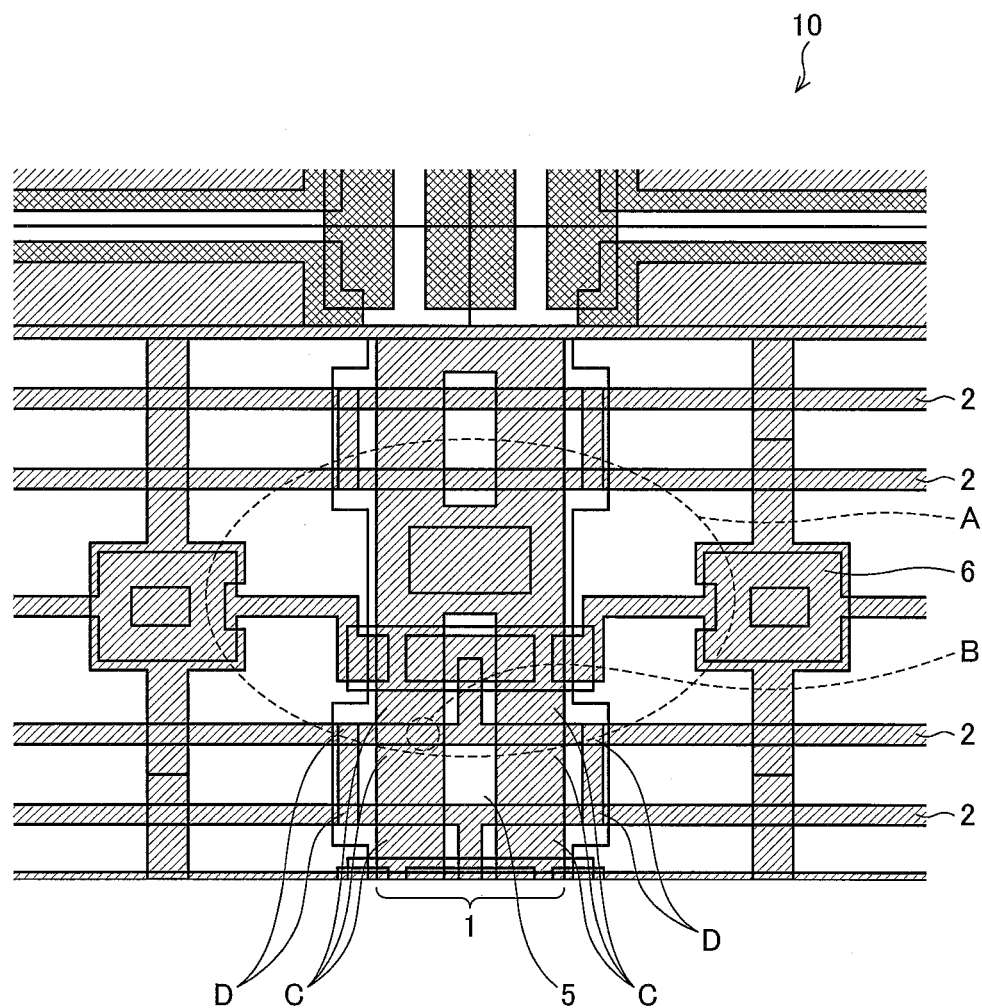
FIG. 1 is a plan view schematically illustrating a configuration of a TFT substrate in accordance with an embodiment (Example 1) of the present invention.
Figure 2:
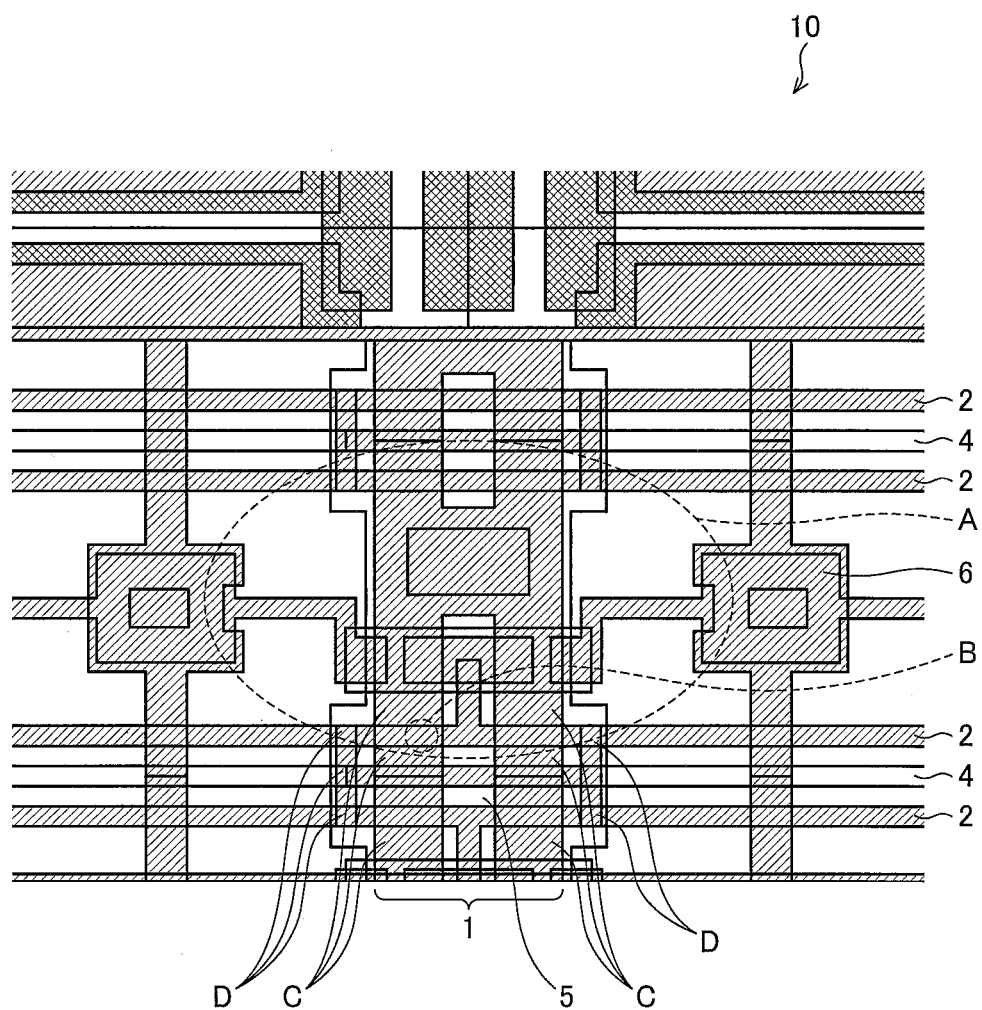
FIG. 2 is a plan view schematically illustrating a configuration of a TFT substrate in accordance with an embodiment (Examples 2 and 3) of the present invention.
Figure 3:
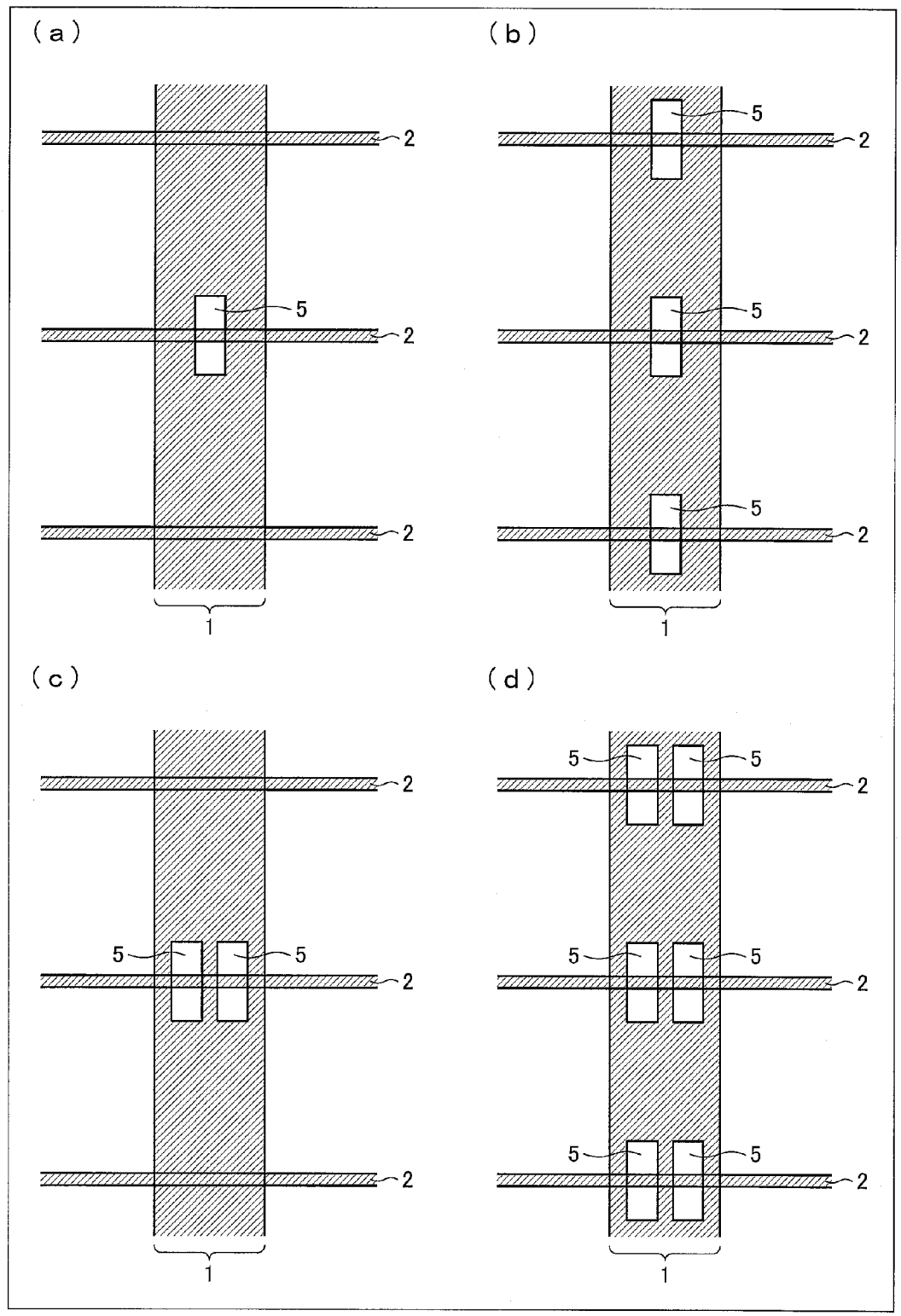
FIG. 3 is a plan view illustrating a configuration of a main part of a TFT substrate in accordance with an embodiment of the present invention. (a) of FIG. 3 illustrates an example case where one (1) intersection region is divided into two by a slit. (b) of FIG. 3 illustrates an example case where each of three intersection regions is divided into two by a slit. (c) of FIG. 3 illustrates an example case where one (1) intersection region is divided into three by two slits. (d) of FIG. 3 illustrates an example case where each of three intersection regions is divided into three by two slits.
Figure 4:
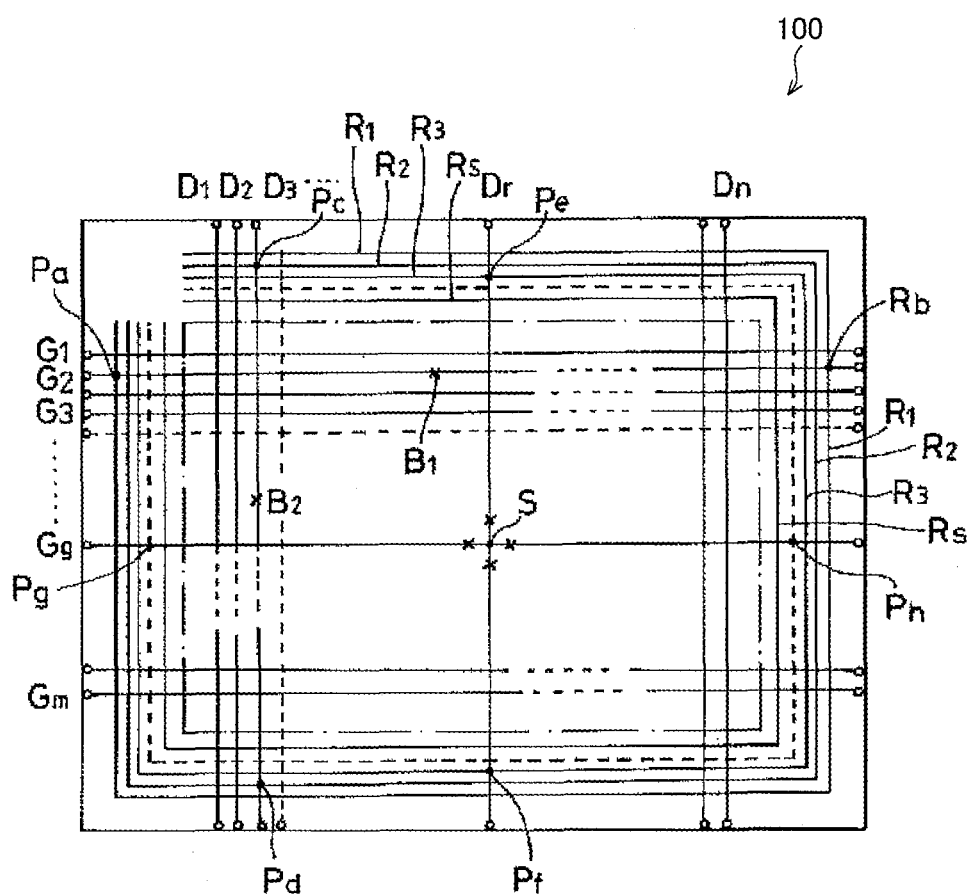
FIG. 4 is a plan view schematically illustrating a configuration of a conventional TFT substrate.

The TFT substrate of the present embodiment is specifically described below with reference to FIGS. 1 through 3. Each of FIGS. 1 and 2 is a plan view schematically illustrating a configuration of a TFT substrate 10 of the present embodiment. FIG. 3 is a plan view illustrating a configuration of a main part of the TFT substrate 10 of the present embodiment.

As illustrated in FIG. 1, the TFT substrate 10 of the preset embodiment is configured so that (i) a plurality of gate lines 1 and a plurality of source lines 2 are arranged in a matrix manner and (ii) a TFT 6 is provided in at least one of intersection regions where the plurality of gate lines 1 and the plurality of source lines 2 intersect with each other, wherein the at least one of intersection regions is divided by a slit 5, which is formed in a corresponding one of the plurality of gate lines 1, so that the at least intersection region is divided into parts arranged along a longitudinal direction of the plurality of source lines 2.

FIG. 2 is a plan view schematically illustrating another configuration of the TFT substrate 10 of the present embodiment (a configuration of the TFT substrate 10, illustrated in FIG. 1, in which a preliminary line 4 is provided). As illustrated in FIG. 2, it is preferable to configure the TFT substrate 10 of the present embodiment such that the preliminary line 4 is provided along one of the plurality of source lines 2 which crosses the slit 5 so that, in a case where the source line 2 is cut, the preliminary line 4 is connected to the source line 2 so as to form a second source line.

The following describes in detail the members.

[TFT Substrate]

The TFT (Thin Film Transistor) substrate 10 of the present embodiment can be identical in configuration to a conventionally well-known TFT substrate, except that a slit 5 is formed in a gate line 1 in the TFT substrate 10 of the present embodiment. Note that a thin film transistor is a transistor constituted by a semiconductor layer, a gate insulating film, an electrode, a protective insulating film, and other components, all of which are formed in the shape of a thin film by use of a method such as vacuum deposition, sputtering, or plasma chemical vapor deposition (plasma CVD).

A structure of the TFT substrate 10 of the present embodiment is not limited to a specific structure, either, and can therefore be a top gate structure or a bottom gate structure.

[Gate Line and Source Line]

The gate line (gate bus line) 1 used in the present embodiment can be a conventionally well-known gate line. The source line (source bus line) 2 used in the present embodiment can also be a conventionally well-known source line.

Materials for the gate line 1 and the source line 2 are not limited to specific materials, provided that the materials are electrically conductive materials. Examples of the materials include (i) metals such as platinum, gold, silver, nickel, chrome, copper, iron, tin, aluminum, titanium, and magnesium, (ii) alloys of the metals, (iii) electrically conductive oxides such as tin oxide and indium oxide, and (iv) semiconductors such as silicon and germanium. Other examples of the materials include (i) conventionally well-known electrically conductive polymers (such as electrically conductive polyaniline, electrically conductive polypyrrole, and electrically conductive polythiophene) whose electrical conductivities have been improved by means of doping etc. and (ii) a complex of polyethylene dioxythiophene and polystylene sulfonic acid.

The gate line and the source line (an electrode) are formed by, for example, (i) processing, by use of a conventionally well-known photolithography or lift-off method, an electrically conductive thin film which is formed with the above materials by use of a method such as vacuum deposition or sputtering or (ii) etching the electrically conductive thin film on a metal foil (such as an aluminum foil or a copper foil) with use of a resist by means of, for example, thermal transfer or ink jet.

According to the present invention, it is preferable in terms of electrical conductivity and processability that the gate line and the source line are formed by etching an aluminum or copper film which has been formed by sputtering. These materials for the gate line and the source line hardly affect the effect of the present invention. Therefore, these materials can be suitably selected in consideration of, for example, (i) how efficiently a wire defect is repaired by use of laser beams, (ii) electrical conductivity required for increasing display capacity and/or (iii) whether or not these materials can be actually used in a manufacturing line.

[Intersection Region]

The TFT substrate 10 of the present embodiment has the intersection regions where the gate lines 1 and the source lines 2 intersect with each other.

In this specification, an intersection region means a region which is formed in a part where a gate line and a source line intersect with each other.

In the TFT substrate 10 of the present embodiment, a wire defect (such as a short circuit or a leakage) which has occurred in the intersection region can be easily solved.

[Slit]

In the TFT substrate 10 of the present embodiment, at least one of the intersection regions is divided by a slit 5, which is formed in a corresponding one of the gate lines 1, so that the at least intersection region is divided into parts arranged along the longitudinal direction of the source lines 2. In other words, the slit 5 crosses the at least intersection region in a width direction of the source lines 2. The slit 5 is formed so as to extend beyond the at least intersection region in the width direction of the source lines 2.

Specifically, in the TFT substrate 10 of the present embodiment, as illustrated in (a) and (c) of FIG. 3, one (1) intersection region can be divided into at least two parts by at least one slit 5 which is formed in a gate line 1 so that the at least two parts are arranged along the longitudinal direction of source lines 2. Alternatively, as illustrated in (b) and (d) of FIG. 3, each of two or more intersection regions can be divided into at least two parts by at least one slit 5 which is formed in a gate line 1 so that the at least two parts are arranged along the longitudinal direction of source lines 2.

Alternatively, in the TFT substrate 10 of the present embodiment, as illustrated in (a) and (b) of FIG. 3, at least one of a plurality of intersection regions can be divided into two by a slit 5, which is formed in a gate line 1, so that the two are arranged along the longitudinal direction of source lines 2. As a further alternative, as illustrated in (c) and (d) of FIG. 3, at least one of a plurality of intersection regions can be divided into at least three by at least two slits 5, which are formed in a gate line 1, so that the at least three are arranged along the longitudinal direction of source lines 2.

The following describes in detail the slit(s).

(Slit)

In this specification, a slit means a through-hole which is formed in a gate line so as to penetrate the gate line toward a surface of a substrate. Examples of the slit include a notch, a gap, a long and narrow through-hole, and a groove through-hole.

The size of a slit is determined according to various conditions of a panel. Specifically, the size of a slit is determined in consideration of not only, needless to say, the widths of a source line and a gate line but also, for example, the size of foreign objects (such as dust) which will cause a wire defect.

(Width of Slit)

According to the present embodiment, a slit 5 formed in a gate line preferably has a width (along the longitudinal direction of a source line) of not less than 1 μm but not more than three fourths of a width of the gate line, and more preferably has a width of not less than 4 μm but not more than half of the width of the gate line.

A preferable lower limit of the width of a slit is determined on the basis of the size of foreign objects (such as dust) which will cause a wire defect. The size of dust in a recent factory where large-sized liquid crystal panels are produced is approximately 0.2 μm on average but sometimes approximately 1 μm. In a case where the size of a slit which is formed in a gate line is not enough larger than that of dust, a defect region cannot sometimes be separated from the gate line.

Theoretically, a preferable upper limit of the width of a slit which is formed in a gate line merely needs to be smaller than the width of the gate line. Note that the width of a gate line is relatively reduced by cutting a part of the gate line, which part sandwiches a slit with the other part of the gate line. This causes an increase in resistance of the other part of the gate line. The gate line itself has an increased resistance due to the presence of the slit. Therefore, the width of the slit should be as small as possible so that the resistance is prevented from being increased. The inventors of the present invention repetitively studied on the basis of such an viewpoint, and found that (i) a panel is not sometimes driven adequately in a case where the width of a slit which is formed in a gate line is more than three fourths of that of the gate line and (ii) a defect in display due to an increase in resistance is not noticeable, in a case where the width of a slit which is formed in a gate line is not more than half of that of the gate line.

(Longitudinal Direction and Width Direction of Source Line)

In the present embodiment, a longitudinal direction of a source line indicates a direction (a lateral direction in FIGS. 1 through 3) in which a signal voltage flows in a TFT substrate. A width direction of the source line indicates a direction (a direction perpendicular to the lateral direction in FIGS. 1 through 3) perpendicular to the longitudinal direction of the source line.

[Preliminary Line and Second Source Line]

As illustrated in FIG. 2, it is preferable to configure the TFT substrate 10 of the present embodiment such that a preliminary line 4 is provided along a source line 2 which crosses a slit 5 so that, in a case where the source line 2 is cut, the preliminary line 4 is connected to the source line 2 to form a second source line. Specifically, in at least one of intersection regions, the preliminary line 4 is provided along the source line 2 in a layer, in which the source line 2 is provided, so as to be unconnected to another electrode line. In the case where the source line 2 is cut, the preliminary line 4 is connected to the source line 2 via lattice points (preliminary line connections D) which can be melted by laser etc, so as to form the second source line.

The second source line is identical in configuration to the source line 2, and brings about an effect identical to that brought about by the source line 2.

[Other Member]

The TFT substrate 10 of the present embodiment can further include a member(s) in addition to the gate lines 1, the source lines 2, and the TFT 6.

(II) Method, of the Present Embodiment, of Solving a Wire Defect in a TFT Substrate A method, of the present embodiment, of solving a wire defect in a TFT substrate includes the step of, in a case where a wire defect occurs in any one of at least two parts into which an intersection region in the TFT substrate is divided, cutting a part of a gate line, which part is present in the any one of at least two parts into which the intersection region is divided.

It is preferable to arrange the method to further include the step of, in a case where a source line is cut by cutting the part of the gate line, forming a second source line by connecting a preliminary line to the source line.

Note here that, according to the present embodiment, a gate line or a source line, which is present in an intersection region where a wire defect has occurred, can be cut by a conventionally well-known method such as laser.

Further, according to the present embodiment, a preliminary line and a source line can be connected to each other by a conventionally well-known method such as laser.

(III) Method of Producing the TFT Substrate of the Present Embodiment

The TFT substrate 10 of the present embodiment can be produced by a conventionally well-known method of producing a TFT substrate, except that a slit 5 is formed in the TFT substrate 10 of the present embodiment. The slit 5 can be formed before or after gate lines 1 are provided, or simultaneously with providing of the gate lines 1.

Further, the slit 5 can be formed by use of a conventionally well-known method, provided that the conventionally well-known method allows a repaired gate line to keep electrically insulated. Examples of the conventionally well-known method include (i) a simple sputtering with use of a mask, (ii) etching with use of a mask, (iii) lift-off which allows the repaired gate line to more reliably keep electrically insulated and (iv) a method of forming steps by means of sputtering. In a case where a part where a slit 5 is to be formed is made from an organic material such as a polymer, the slit 5 can be formed by use of a method such as a selective exposure treatment or ion implantation.

Generally, conventionally, gate lines and source lines are formed through respective patterning processes. It is therefore industrially preferable that the slit 5 is formed during the patterning processes.

(IV) Device for Producing the TFT Substrate of the Present Embodiment

The TFT substrate 10 of the present embodiment can be produced by use of a conventionally well-known device for producing a TFT substrate, except that a slit 5 is formed in the TFT substrate 10 of the present embodiment.

(V) How a Display Device of the Present Embodiment is Configured

A display device of the present embodiment can be configured to be a conventionally well-known display device (such as a liquid crystal display device) except for including the TFT substrate 10.

It is preferable to configure the display device of the present embodiment such that (i) the display device includes a plurality of source drivers for supplying data signals to the source lines and (ii) the source lines are divided so as to correspond to the plurality of source drivers. (It is preferable that the display device has a double-source structure).

(VI) Concrete Examples of the TFT Substrate of the Present Embodiment (Examples and Comparative Example)

The following description will discuss concrete examples of the TFT substrate of the present embodiment. Note, however, that the TFT substrate of the present invention is not limited only to the concrete examples below.

COMPARATIVE EXAMPLE

Figure 5:
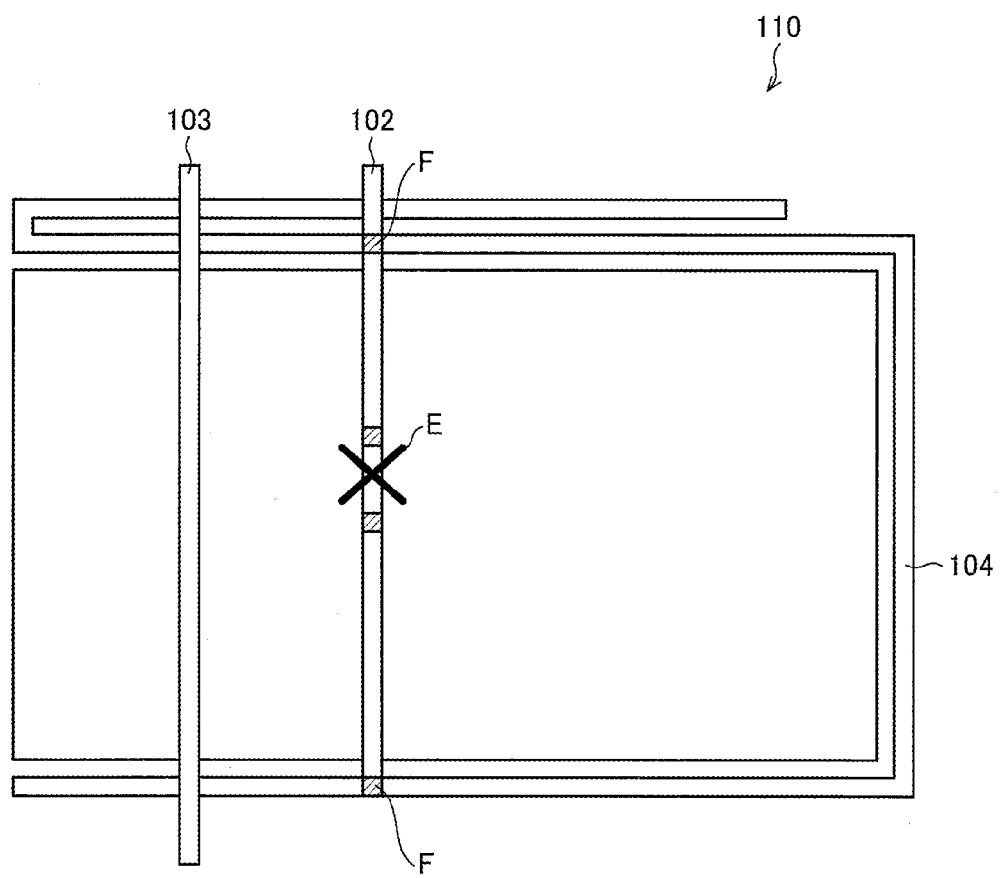
FIG. 5 is an explanatory view schematically illustrating a configuration of a conventional TFT substrate.

FIG. 5 is a view schematically illustrating a conventional method of solving a wire defect by use of a preliminary wire (preliminary line). In a case where a wire defect part E at an intersection where a source line 102 and a gate line (not illustrated) intersect with each other is left as it is in a TFT substrate 110, the whole source line 102 becomes a bright line. In order to prevent the bright line, according to the conventional method, the wire defect part E is cut from the source line 102. Then, the source line 102 is connected to a preliminary wire 104 at two connections F which are located along a direction of a panel, which direction is parallel to the source line 102. This allows a voltage to be supplied, as originally supplied, to a part of the source line 102, which part is upper than the wire defect part E in FIG. 5. This also allows a voltage to be supplied via a bypass route toward the wire defect part D from the other part of the source line 102, which other part is lower than the wire defect part E in FIG. 5. This ultimately restores, to a normal state, display due to pixels which are provided along the source line 102.

A person who employs the conventional method can repair defects in the whole panel by use of minimally-required preliminary wires 104 which are provided in consideration of frequency of occurrence of wire defects.

An increase in display capacity, for example, in an order of HD, FHD, 4K2K, and 8K4K (SHV), makes it difficult to write a signal into a panel during a predetermined refresh time period. In order to increase an apparent refresh time period during which TFTs are refreshed, it is necessary to employ a structure such as a double-source structure or a structure in which upper and lower parts of a panel are driven separately.

The present invention is applicable to, for example, such a liquid crystal display element that has particularly a large display capacity.

Figure 6:
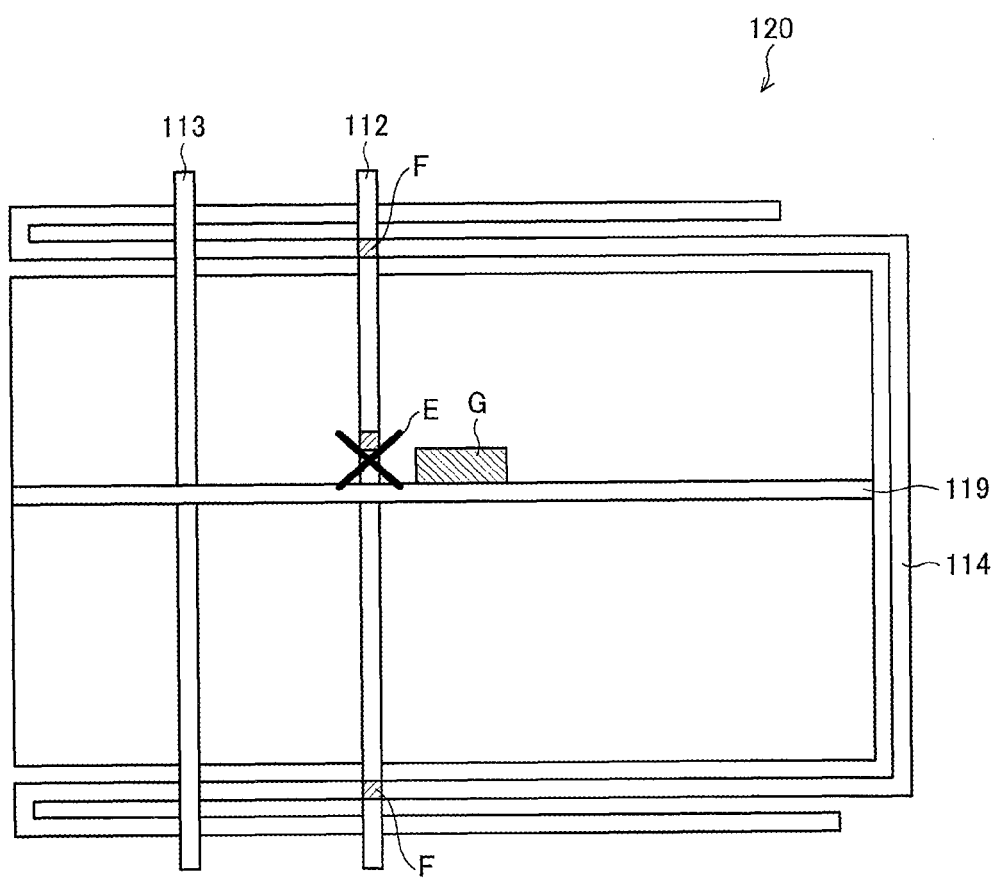
FIG. 6 is an explanatory view schematically illustrating a configuration of a conventional TFT substrate.

Note here that, in a case where a wire defect of a source line 112 is repaired by use of a preliminary wire by the conventional method in a panel which is divided into upper and lower parts (see FIG. 6), it is not possible to supply a signal to the source line 112 from a lower part of the panel after the wire defect is repaired, and consequently, a part of the source line 112, which part extends from the wire defect to the center of the panel, remains as a defect (see G in FIG. 6). This is because (i) drivers are provided for the respective upper and lower parts of the panel in a TFT substrate 120 and (ii) source lines are divided by a panel center 119 (see FIG. 6).

Note that a ladder structure in which two source lines, one of which is allowed to be cut, extend in parallel is conventionally known. However, an increase in display capacity causes an increase in wiring area. This causes a great reduction in aperture ratio of a panel, thereby causing a great reduction in luminance (transmission of the panel).

The present invention was made in view of the problems. According to the present invention, an influence on an aperture ratio is minimized, whereas a panel includes a redundancy wire.

EXAMPLE 1

FIG. 1 illustrates a basic pixel structure employed by Example 1. A source line 2 and a gate line 1 are connected to a pixel A which is encircled. The TFT substrate 10 of Example 1 has a double-source structure. Specifically, the source line 2 is connected to a lower part of the pixel A. The gate line 1 is divided into two by a slit 5 in an intersection region where the gate line 1 intersects the source line 2.

According to Example 1, in a case where a short circuit (a wire defect, a leakage) happens to a part B (see FIG. 1) in the intersection region, the gate line 1 and the source line 2 are electrically disconnected from each other by cutting, among parts (of the source line 2 or the gate line 1, or SG) to be cut, the part B of the gate line 1 by means of laser. The gate line 1 is thus divided into the two by the slit 5 in the intersection region so that the two are arranged in parallel with each other. Therefore, even in a case where one of the two is cut, the whole gate line 1 remains uncut.

EXAMPLE 2

FIG. 2 illustrates a basic pixel structure employed by Example 2. A source line 2 and a gate line 1 are connected to a pixel A which is encircled. A preliminary line 4 is provided between the source line 2 and another source line 2. The preliminary line 4 is not connected to any electrode in a normal state. The TFT substrate 10 of Example 2 has a double-source structure. Specifically, the source line 2 is connected to a lower part of the pixel A. The gate line 1 is divided into two by a slit 5 in an intersection region where the gate line 1 intersects the source line 2.

Example 2 illustrates an example case where a short circuit (a wire defect, a leakage) happens to a part B (see FIG. 2) in the intersection region.

A wire defect is most frequently caused by a foreign object among various factors which cause the wire defect. Needless to say, the size and location of the foreign object are not controllable. Therefore, for example, in a case where a foreign object on the source line 2 protrudes from the source line 2 so as to remarkably extend onto the gate line 1, it is difficult to cut the gate line 1. In this case, the part B of the source line 2 is cut, and then the source line 2 thus cut is connected to the preliminary line 4 by melting by means of laser a preliminary connection (preliminary wire (preliminary line) connection) D where the source line 2 is to be connected to the preliminary line 4. This allows an electric connection of the source line 2 to be restored.

EXAMPLE 3

The preliminary line 4 (see FIG. 2) can also be employed as a backup line, for example, in a case where the source line 2 is accidentally cut during cutting of the gate line 1 or in a case where the source line 2 is made thin during cutting of the gate line 1.

[Summary of Examples]

A short circuit at an intersection where a gate line and a source line intersect with each other is a most serious defect among wire defects. This is because the short circuit causes the intersection to become bright in the shape of a cross. According to Examples 1 through 3, however, it is possible to repair the short circuit without (i) providing a redundancy wire in a region other than a display region and (ii) reducing an aperture ratio unnecessarily.

(VII) Other Embodiment

The present invention is not limited to the description of the embodiment above, and can therefore be modified by a skilled person in the art within the scope of the claims. Namely, an embodiment derived from a proper combination of technical means disclosed in different embodiments is encompassed in the technical scope of the present invention.

The technical scope of the present invention also encompasses a TFT substrate, a wire repairing method, and a display device of Embodiment below.

It is preferable that at least one of intersection regions is divided into three by two slits, which are formed in a corresponding gate line, so that the three are arranged along a longitudinal direction of a source line.

It is preferable to configure the TFT substrate of the present invention such that a preliminary line is provided along one of the plurality of source lines which crosses the slit so that, in a case where the source line is cut, the preliminary line is connected to the source line so as to form a second source line.

In a case where it is difficult to cut a gate line, a source line which is connected to (intersects) the gate line is sometimes accidentally cut. In the TFT substrate of the present invention thus configured above, however, for example, in a case where a source line is cut by cutting an intersection region where a wire defect has occurred, the source line can be easily repaired.

A method of the present invention of solving a wire defect in a TFT substrate is configured to include the step of: in a case where a wire defect occurs in any one of at least two parts into which the at least intersection region is divided, cutting a part of the corresponding gate line, which part is present in the any one of at least two parts into which the at least intersection region is divided.

In the TFT substrate, the slit is formed in the corresponding gate line. It is therefore possible to easily cut the part of the corresponding gate line, to which part a defect has happened. This allows the method of the present invention to easily solve a wire defect with electric connection of the whole TFT substrate kept.

A method of the present invention of solving a wire defect in a TFT substrate is configured to include the steps of: in a case where a wire defect occurs in any one of at least two parts into which the at least intersection region is divided, cutting a part of the corresponding gate line, which part is present in the any one of at least two parts into which the at least intersection region is divided; and in a case where the source line is cut by cutting the part of the corresponding gate line, forming a second source line by connecting the preliminary line to the source line.

In the TFT substrate, the slit is formed in the corresponding gate line. It is therefore possible to easily cut the part of the corresponding gate line, to which part a defect has happened. It is also possible that, even if the source line is cut during cutting of the part of the corresponding gate line, the source line is easily repaired by use of the preliminary line which is provided along the source line. This allows the method of the present invention to easily solve a wire defect while repairing the source line thus cut.

A display device of the present invention is configured to include the above-described TFT substrate. A display device of the present invention is configured to include a TFT substrate in which a wire defect is solved by the above-described method.

Therefore, in the display device of the present invention, even in a case where a wire defect happens to the TFT substrate, the wire defect can be easily solved. This allows a faction of the display device to be easily restored. As such, it is possible to easily suppress (i) occurrence of a wire defect and (ii) a problem with display caused due to the wire defect.

INDUSTRIAL APPLICABILITY

The present invention is applicable to a field such as the field of liquid crystal displays.

REFERENCE SIGNS LIST

1: gate line
2: source line
4: preliminary line
5: slit
6: TFT
10: TFT substrate

The invention claimed is:

1. A TFT substrate being configured such that (i) a plurality of gate lines and a plurality of source lines are arranged in a matrix manner and (ii) a TFT is provided in at least one of intersection regions where the plurality of gate lines and the plurality of source lines intersect with each other,
   wherein the at least one of intersection regions is divided by a slit, which is formed in a corresponding one of the plurality of gate lines, so that the at least one of intersection regions is divided into parts arranged along a longitudinal direction of the plurality of source lines,
   wherein the slit has a width of not less than 4 μm but not more than half of a width of the corresponding one of the plurality of gate lines, and
   wherein a preliminary line is provided along one of the plurality of source lines which crosses the slit so that, in a case where the source line is cut, the preliminary line is connected to the source line so as to form a second source line.

2. A display device, comprising:
   the TFT substrate as set forth in claim 1.

3. A method of solving a wire defect in a TFT substrate as set forth in claim 1, comprising:
   in a case where a wire defect occurs in any one of at least two parts into which the at least one of intersection regions is divided, cutting a part of the corresponding gate line, which part is present in the any one of at least two parts into which the at least one of intersection regions is divided.

4. A display device, comprising:
   the TFT substrate in which a wire defect has been solved by a method as set forth in claim 3.

5. A method of solving a wire defect in a TFT substrate as set forth in claim 1, comprising:
   in a case where a wire defect occurs in any one of at least two parts into which the at least one of intersection regions is divided, cutting a part of the corresponding gate line, which part is present in the any one of at least two parts into which the at least one of intersection regions is divided, wherein
   the second source line is formed in a case where the source line is cut by cutting the part of the corresponding gate line.

* * * * *